United States Patent
Lee

(10) Patent No.: US 10,136,523 B2
(45) Date of Patent: Nov. 20, 2018

(54) DISPLAY DEVICE AND METHOD OF MANUFACTURING DISPLAY DEVICE

(71) Applicant: Samsung Display Co., Ltd., Yongin-si, Gyeonggi-do (KR)

(72) Inventor: Dong-gyu Lee, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/251,963

(22) Filed: Aug. 30, 2016

(65) Prior Publication Data

US 2017/0202095 A1    Jul. 13, 2017

(30) Foreign Application Priority Data

Jan. 11, 2016    (KR) .................. 10-2016-0003277

(51) Int. Cl.
| | | |
|---|---|---|
| *H05K 5/00* | (2006.01) | |
| *H05K 7/18* | (2006.01) | |
| *H04M 1/02* | (2006.01) | |

(52) U.S. Cl.
CPC ........ *H05K 5/0017* (2013.01); *H04M 1/0266* (2013.01); *H05K 7/18* (2013.01)

(58) Field of Classification Search
CPC . H05K 5/0017–5/0034; G02F 1/13452; G06F 3/0416; G06F 1/1643
See application file for complete search history.

(56) References Cited

U.S. PATENT DOCUMENTS

| | | | |
|---|---|---|---|
| 2012/0007106 A1 | 1/2012 | Jung et al. | |
| 2012/0228106 A1* | 9/2012 | Horino | G06F 3/044 200/5 A |
| 2013/0161177 A1* | 6/2013 | Lee | G06F 3/044 200/512 |
| 2013/0330495 A1* | 12/2013 | Maatta | B23P 11/00 428/68 |
| 2014/0159569 A1 | 6/2014 | Hwang | |
| 2014/0204286 A1* | 7/2014 | Park | G06F 1/1626 349/12 |

(Continued)

FOREIGN PATENT DOCUMENTS

| | | |
|---|---|---|
| KR | 10-2005-0098578 A | 10/2005 |
| KR | 10-0946282 B1 | 3/2010 |

(Continued)

*Primary Examiner* — Hoa C Nguyen
(74) *Attorney, Agent, or Firm* — Lewis Roca Rothgerber Christie LLP

(57) ABSTRACT

A display device includes a window member including a transparent base member having a first area and a second area, and a deco member under the transparent base member and overlapping with the second area, a display panel under the window member and having a display area overlapping with the first area, and a non-display area overlapping with the second area, the display panel including a pad unit on a portion of the non-display area, an adhesive member between the window member and the display panel for bonding the window member and the display panel to each other, a printed circuit board connected to the pad unit of the display panel, and a block pattern printed on a portion of a bottom surface of the deco member that is adjacent the adhesive member, the block pattern overlapping with the pad unit.

18 Claims, 14 Drawing Sheets

(56) References Cited

U.S. PATENT DOCUMENTS

2014/0211431 A1 7/2014 Um et al.
2014/0367648 A1 12/2014 Cho et al.

FOREIGN PATENT DOCUMENTS

| KR | 10-2013-0049014 A | 5/2013 |
| KR | 10-2013-0127173 A | 11/2013 |
| KR | 10-1457698 B1 | 11/2014 |

\* cited by examiner

DISPLAY DEVICE AND METHOD OF MANUFACTURING DISPLAY DEVICE

CROSS-REFERENCE TO RELATED APPLICATION

This application claims priority to, and the benefit of, Korean Patent Application No. 10-2016-0003277, filed on Jan. 11, 2016, in the Korean Intellectual Property Office (KIPO), the entire content of which in its entirety is herein incorporated by reference.

BACKGROUND

1. Field

One or more aspects of example embodiments of the present disclosure relate to display devices and methods of manufacturing a display device.

2. Description of the Related Art

Various display devices used in multimedia devices, such as televisions, mobile phones, navigations, computer monitors, and/or game consoles, are being developed. Display devices provide an image having information (e.g., predetermined information) to a user. The display devices include an area (display area) configured to display the image on the front, and an area (non-display area) that does not display an image. The non-display area is recognized by the user as a colored bezel (or edge).

The bezel of the display device may be defined by a deco member, which is disposed on a surface (e.g., one surface) of strengthened glass or reinforced plastic. The deco member is formed by directly printing an ink layer (hereinafter, referred to as a "printing method") or by attaching a film on which a print layer is disposed, on the surface of the strengthened glass or reinforced plastic (hereinafter, referred to as a "lamination method").

The above information disclosed in this Background section is for enhancement of understanding of the background of the inventive concept, and therefore, it may contain information that does not constitute prior art.

SUMMARY

One or more aspects of example embodiments of the present disclosure provide a display device, which may prevent or reduce deterioration of a deco member for defining a bezel part of the display device, and a method of manufacturing a display device.

An embodiment of the inventive concept provides a display device including a window member including a transparent base member having a first area and a second area, and a deco member under the transparent base member and overlapping with the second area, a display panel under the window member and having a display area overlapping with the first area, and a non-display area overlapping with the second area, the display panel including a pad unit on a portion of the non-display area, an adhesive member between the window member and the display panel for bonding the window member and the display panel to each other, a printed circuit board connected to the pad unit of the display panel, and a block pattern printed on a portion of a bottom surface of the deco member that is adjacent the adhesive member, the block pattern overlapping with the pad unit.

The block pattern may be printed along any one of edges defining a boundary between the adhesive member and the deco member.

The block pattern may be configured to block contact between the adhesive member and the deco member.

The display device may further include an auxiliary block pattern printed on a bottom surface of the transparent base member along the boundary between the adhesive member and the deco member, the auxiliary block pattern extending from the block pattern.

The display device may further include a blocking tape on a portion of the bottom surface of the deco member adjacent the block pattern, the blocking tape being configured to prevent the adhesive member from contacting the deco member.

The deco member may be directly printed on the transparent base member.

The deco member may include a deco base film, and a deco ink layer printed on a bottom surface of the deco base film.

A width of the block pattern may decrease away from the adhesive member on a plane parallel to a plane on which the display area is defined.

The adhesive member may include a resin.

The first area may include a first edge parallel to a boundary between the adhesive member and the deco member, a second edge extending from one end of the first edge and being perpendicular to the first edge, a third edge extending from another end of the first edge and being perpendicular to the first edge, and a fourth edge extending from one end of the second edge to one end of the third edge, and being parallel to the first edge, the second area may include a first bezel area extending from the first edge and overlapping with the pad unit, a second bezel area extending from the second edge, a third bezel area extending from the third edge and facing the second bezel area, the first area being between the second bezel area and the third bezel area, and a fourth bezel area extending from the fourth edge and facing the first bezel area, the first area being between the first bezel area and the fourth bezel area, and the block pattern may overlap with the first bezel area.

An embodiment of the inventive concept provides a display device including a window member including a transparent base member, a deco member overlapping with an edge of the transparent base member, and a block pattern printed under the deco member along any one of inner boundary edges of the deco member, a display panel bonded to a bottom of the window member by an adhesive member, and a printed circuit board between the window member and the display panel overlapping with the block pattern at a side of the display panel, wherein the block pattern prevents contact between the deco member and the adhesive member.

The display device may further include an auxiliary block pattern printed on a bottom surface of the transparent base member along a boundary between the adhesive member and the deco member, the auxiliary block pattern extending from the block pattern.

The display device may further a blocking tape on a portion of a bottom surface of the deco member adjacent to the block pattern, the blocking tape blocking contact between the deco member and the adhesive member.

The deco member may be directly printed on the transparent base member.

The deco member may include a deco base film, and a deco ink layer printed on a bottom surface of the deco base film.

A width of the block pattern may decrease away from the adhesive member.

The adhesive member may include a resin.

In an embodiment of the inventive concept, a method of manufacturing a display device includes preparing a window member including a transparent base member having a first area and a second area surrounding the first area, a deco member under the transparent base member and overlapping with the second area, and a block pattern printed on a bottom surface of the deco member, aligning a display panel and the window member to face each other, the display panel including a pad unit coupled to a printed circuit board and having a display area overlapping with the first area, and a non-display area overlapping with the second area, disposing a liquid adhesive member between the window member and the display panel, bonding the display panel and the window member to each other so that the block pattern is adjacent a boundary between the display area and the non-display area, and curing the liquid adhesive member with light.

The block pattern may be printed adjacent any one of inner edges of the deco member.

BRIEF DESCRIPTION OF THE DRAWINGS

The accompanying drawings are included to provide a further understanding of the inventive concept, and are incorporated in, and constitute a part of, this specification. The drawings illustrate exemplary embodiments of the inventive concept, and together with the description, serve to explain aspects of embodiments of the inventive concept. In the drawings.

DETAILED DESCRIPTION OF PREFERRED EMBODIMENTS

Figure 1:
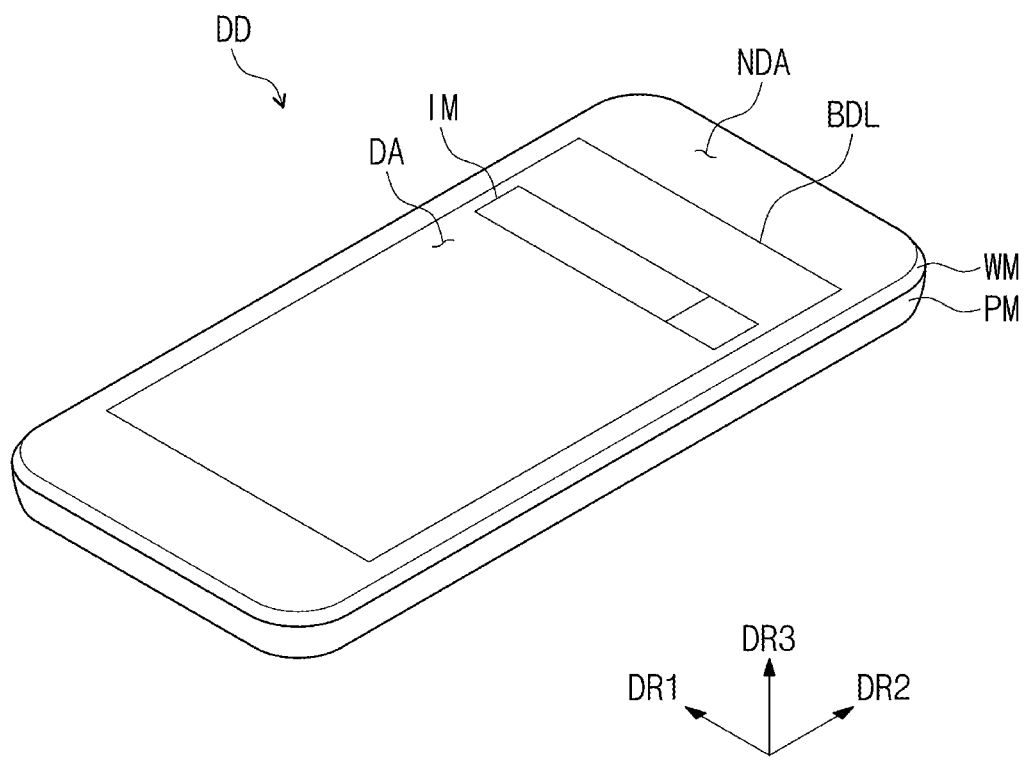
FIG. 1 is a perspective view illustrating a display device according to an embodiment of the inventive concept.

Hereinafter, example embodiments will be described in more detail with reference to the accompanying drawings. The present inventive concept, however, may be embodied in various different forms, and should not be construed as being limited to only the illustrated embodiments herein. Rather, these embodiments are provided as examples so that this disclosure will be thorough and complete, and will fully convey the aspects and features of the inventive concept to those skilled in the art. Accordingly, processes, elements, and techniques that are not necessary to those having ordinary skill in the art for a complete understanding of the aspects and features of the inventive concept may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the inventive concept.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the inventive concept refers to "one or more embodiments of the inventive concept." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
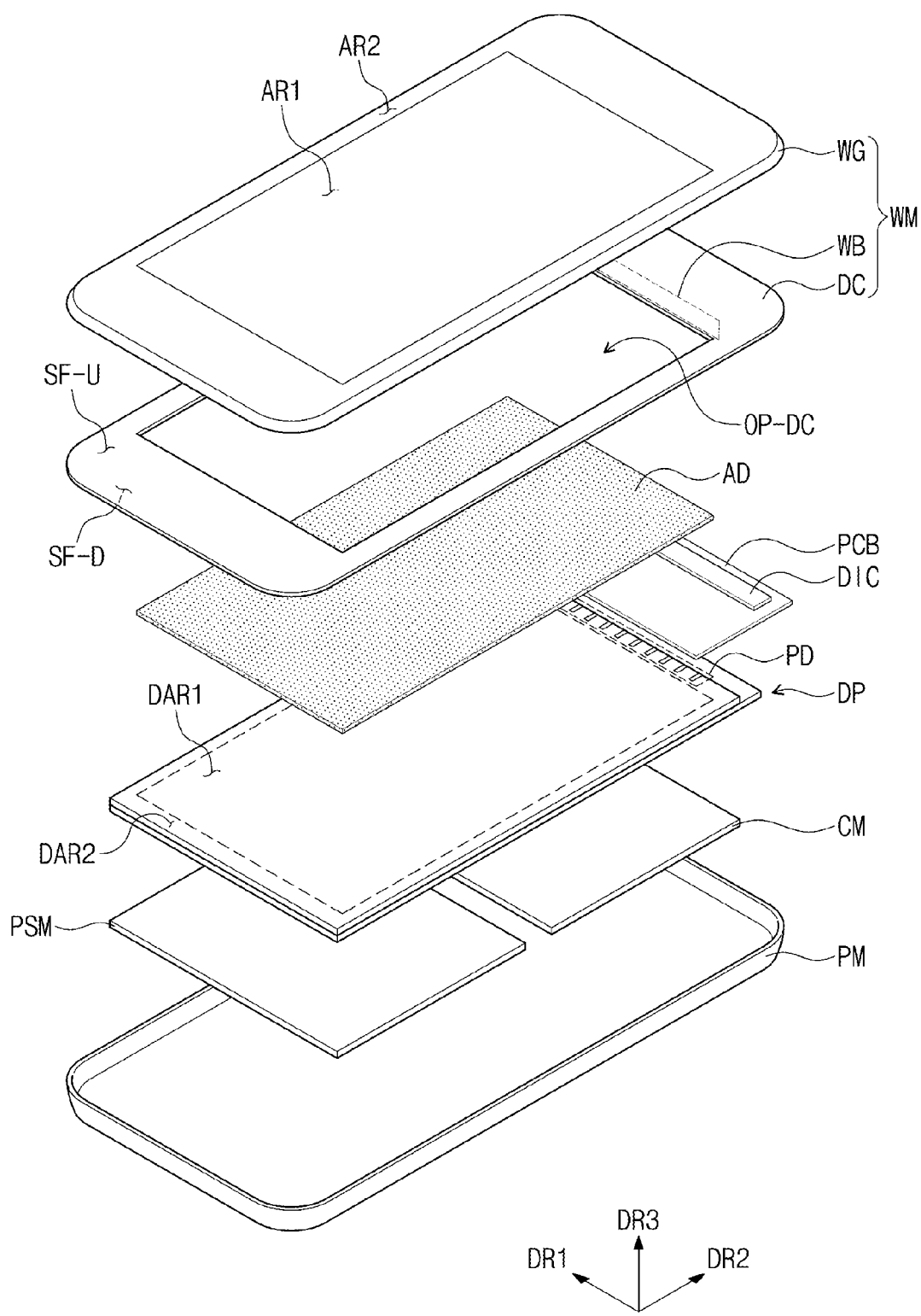
FIG. 2 is an exploded perspective view of the display device illustrated in FIG. 1.
Figure 3:
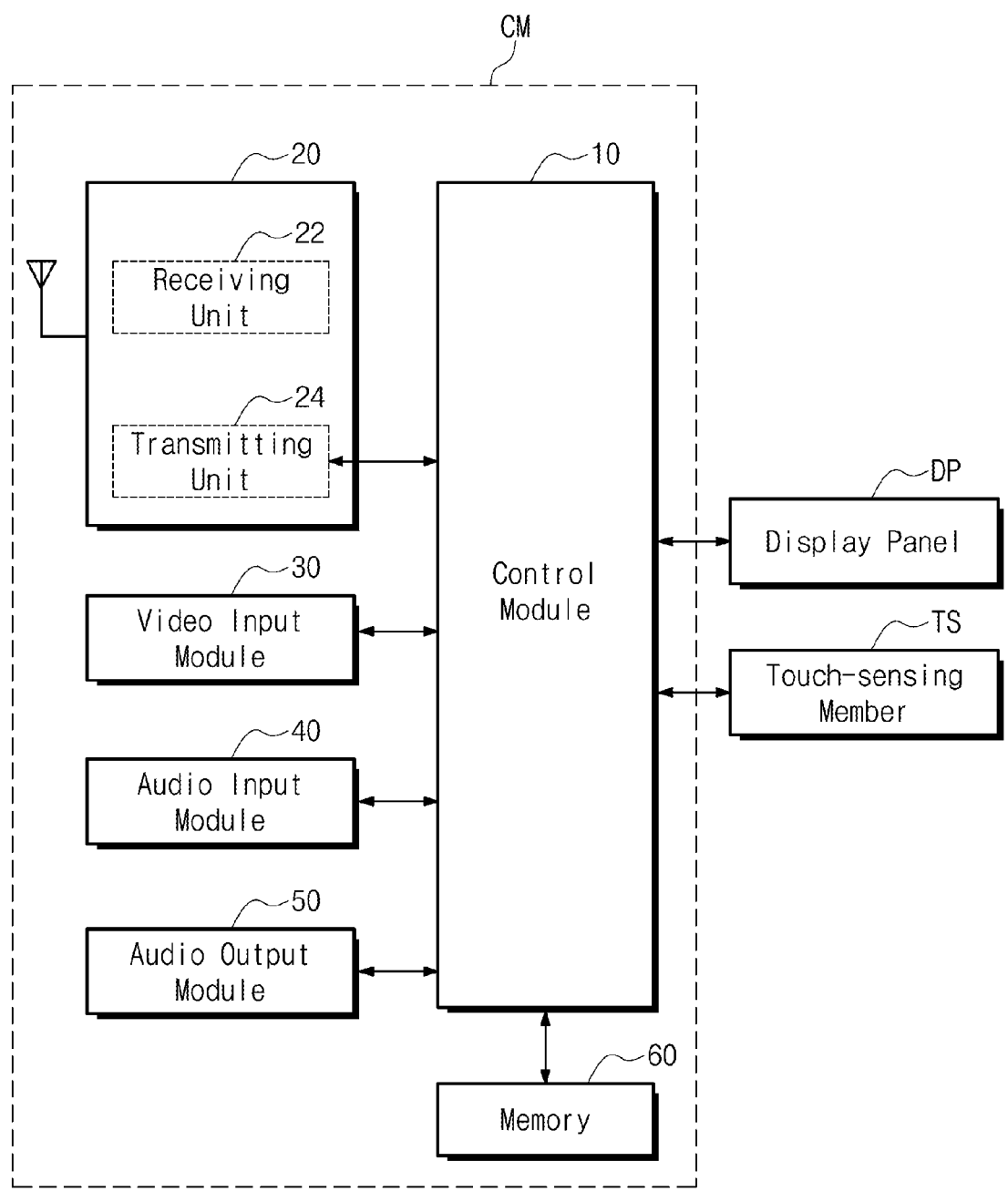
FIG. 3 is a block diagram of the display device illustrated in FIG. 1.

FIG. 1 is a perspective view illustrating a display device DD according to an embodiment of the inventive concept. FIG. 2 is an exploded perspective view of the display device DD illustrated in FIG. 1. FIG. 3 is a block diagram of the display device DD illustrated in FIG. 1. Although a mobile phone is illustrated in FIGS. 1 through 3, the inventive concept is not limited thereto, and the display device may be variously embodied in various information providing devices, such as televisions, navigations, computer monitors, and/or game consoles, for example.

As illustrated in FIG. 1, the display device DD includes a plurality of separated areas at the front of the display device DD. A front surface of the display device DD is a surface on which an image IM is displayed, and may be defined by/parallel to a first direction DR1 and a second direction DR2, which may be perpendicular to each other.

The display device DD includes a display area DA, at (e.g., in) which the image IM is displayed, and a non-display area NDA adjacent the display area DA. The display area DA and the non-display area NDA are divided by a boundary BDL. FIG. 1 illustrates an internet search window as an example of the image IM.

For example, the display area DA may have a rectangular shape. The non-display area NDA surrounds the display area DA. In other words, the non-display area NDA defines an edge of the front surface. According to one or more embodiments of the inventive concept, the shape of the non-display area NDA may be variously modified. For example, the non-display area NDA may not define the edge, and/or portions of the non-display area NDA facing the first direction DR1 in FIG. 1 may be omitted.

As illustrated in FIG. 2, the display device DD according to an embodiment of the inventive concept includes a window member WM, a display panel DP, a printed circuit board PCB, an adhesive member AD, a power supply unit (e.g., a power supply or a power supply source) PSM, a circuit unit (e.g., a circuit) CM, and a protective member PM. The window member WM and the display panel DP may be stacked in a third direction DR3 that is perpendicular to the first and second directions DR1 and DR2.

The window member WM may include a transparent base member WG, a deco member DC, and a block pattern WB.

The transparent base member WG may include glass or plastic. For example, the transparent base member WG may include strengthened glass or reinforced plastic. The transparent base member WG may include a first area AR1 and a second area AR2. The first area AR1 overlaps with the display area DA in the third direction DR3. The second area AR2 overlaps with the non-display area NDA in the third direction DR3. The window member WM includes a transparent portion through which the image IM provided from the display panel DP may be transmitted, and the transparent portion corresponds to the first area AR1.

The deco member DC is disposed under the transparent base member WG. The deco member DC overlaps with the second area AR2 in the third direction DR3. Accordingly, an opening OP-DC overlapping with, or corresponding to, the first area AR1 of the transparent base member WG in the third direction DR3 may be defined in, or by, the deco member DC. The display area DA and the non-display area NDA of the display device DD may be respectively defined by the opening OP-DC and the deco member DC.

The deco member DC provides a deco pattern at the non-display area NDA on the front of the display device DD. The deco pattern may be a monochrome pattern or a pattern in which a plurality of colors are provided and/or mixed.

The deco member DC may include a top surface SF-U and a bottom surface SF-D. The top surface SF-U of the deco member DC is adjacent to the transparent base member WG, and the bottom surface SF-D is adjacent the display panel DP.

The block pattern WB is printed on the bottom surface SF-D of the deco member DC. An ink may be used in a process of printing the block pattern WB.

Referring to FIGS. 2 and 3, a touch-sensing member TS (or touch screen) may be between the display panel DP and the window member WM. The touch-sensing member TS calculates coordinate information of an external input (e.g., a touch input). Herein, the external input denotes an input by a stylus pen and/or a user's finger. The external input may occur on the window member WM. A resistive touch panel, a capacitive touch panel, or an electromagnetic induction touch panel may be used as the touch-sensing member TS.

The touch-sensing member TS includes at least one substrate, an insulating layer, and a plurality of conductive layers. In some embodiments, the touch-sensing member TS may be prepared in a separate process, and the display panel DP may be bonded to the touch-sensing member TS through an optically clear adhesive layer. In some embodiments of the inventive concept, the touch-sensing member TS may be formed (e.g., directly formed) on the display panel DP. For example, any one of the plurality of conductive layers may be disposed (e.g., directly disposed) on a surface (e.g., a top surface) of the display panel DP. However, the inventive concept is not limited thereto, and in some embodiments of the inventive concept, the touch-sensing member TS may be omitted.

The display panel DP generates the image IM. The display panel DP is not particularly limited to any kind of display panel, and for example, an organic light emitting display panel, a liquid crystal display panel, a plasma display panel, an electrophoretic display panel, and/or an electrowetting display panel may be used.

The display panel DP includes a first area DAR1 and a second area DAR2. The first area DAR1 of the display panel is an area configured to generate the image IM, and overlaps with the first area AR1 of the transparent based member WG. The second area DAR2 of the display panel is an area that assists the first area DAR1 to generate the image IM, and overlaps with the second area AR2 of the transparent based member WG. The first area DAR1 of the display panel DP may correspond to the display area DA, and the second area DAR2 of the display panel DP may correspond to the non-display area NDA.

The display panel DP may include a pad unit PD. The pad unit PD may be disposed on a side (e.g., one side) of the display panel DP. The pad unit PD may be disposed on a short side of the display panel DP, but the inventive concept is not limited thereto.

The pad unit PD includes a plurality of electrodes. The pad unit PD is connected to the printed circuit board PCB. The pad unit PD may allow the display panel DP to generate the image IM by receiving electrical signals that are transmitted through the printed circuit board PCB.

The printed circuit board PCB is connected to the pad unit PD. The printed circuit board PCB may be a flexible printed circuit board FPCB having flexibility. A driving circuit DIC is mounted on the printed circuit board PCB. The printed circuit board PCB may transmit electrical signals received from the driving circuit DIC to the pad unit PD.

The adhesive member AD may be disposed between the window member WM and the display panel DP. The adhesive member AD bonds the window member WM and the display panel DP to each other. The adhesive member AD may be transparent to transmit the image IM generated from the display panel DP. Accordingly, the adhesive member AD may include a resin. The resin may include an epoxy resin or a urethane resin. However, the inventive concept is not limited thereto, and the adhesive member AD may include an optical clear adhesive (OCA).

The protective member PM accommodates the display panel DP, the touch-sensing member TS, the power supply unit PSM, and the circuit unit CM. The protective member PM may be coupled to the window member WM. FIG. 2 exemplarily illustrates the protective member PM that is composed of a single member. However the inventive concept is not limited thereto, for example, the protective member PM may include two or more parts that are coupled to each other.

The power supply unit PSM provides power used for driving the display device DD. The power supply unit PSM may provide a driving voltage to the display panel DP and to the touch-sensing member TS. The circuit unit CM includes a circuit board and electronic modules connected to the circuit board. The circuit board includes a plurality of insulating layers and a plurality of wiring layers. Some of the electronic modules may be mounted on the circuit board, and other of the electronic modules may be connected to the circuit board by a flexible circuit board.

The electronic modules will be described in more detail with reference to FIG. 3. As illustrated in FIG. 3, the electronic modules may include a control module (e.g., a controller) 10, a wireless communication module (e.g., a wireless communicator, or a wireless receiver/transmitter) 20, a video input module (e.g., a camera) 30, an audio input module (e.g., a microphone) 40, an audio output module (e.g., a speaker) 50, and memory 60.

The control module 10 controls overall operations of the display device DD. For example, the control module 10 activates or deactivates the display panel DP and/or the touch-sensing member TS. The control module 10 may control the display panel DP, the video input module 30, the audio input module 40, and/or the audio output module 50, based on a touch signal received from the touch-sensing member TS.

The wireless communication module 20 may transmit/receive a wireless signal to/from another terminal by using, for example, a Bluetooth or Wi-Fi line. The wireless communication module 20 may transmit/receive a voice signal by using a general communication line. The wireless communication module 20 includes a receiving unit (e.g., a receiver) 22 configured to receive a modulated signal and to demodulate a received signal, and a transmitting unit (e.g., a transmitter) 24 configured to modulate a signal to be transmitted and to transmit a modulated signal.

The video input module 30 processes an image signal to transform the processed signal to image data that may be input to the display panel DP. The audio input module 40 receives an external sound signal through a microphone in a recording mode or a voice recognition mode, and transforms the received signal into electric sound data. The audio output module 50 transforms sound data received from the wireless communication module 20 or sound data stored in the memory 60, and outputs the transformed sound data.

Figure 4:
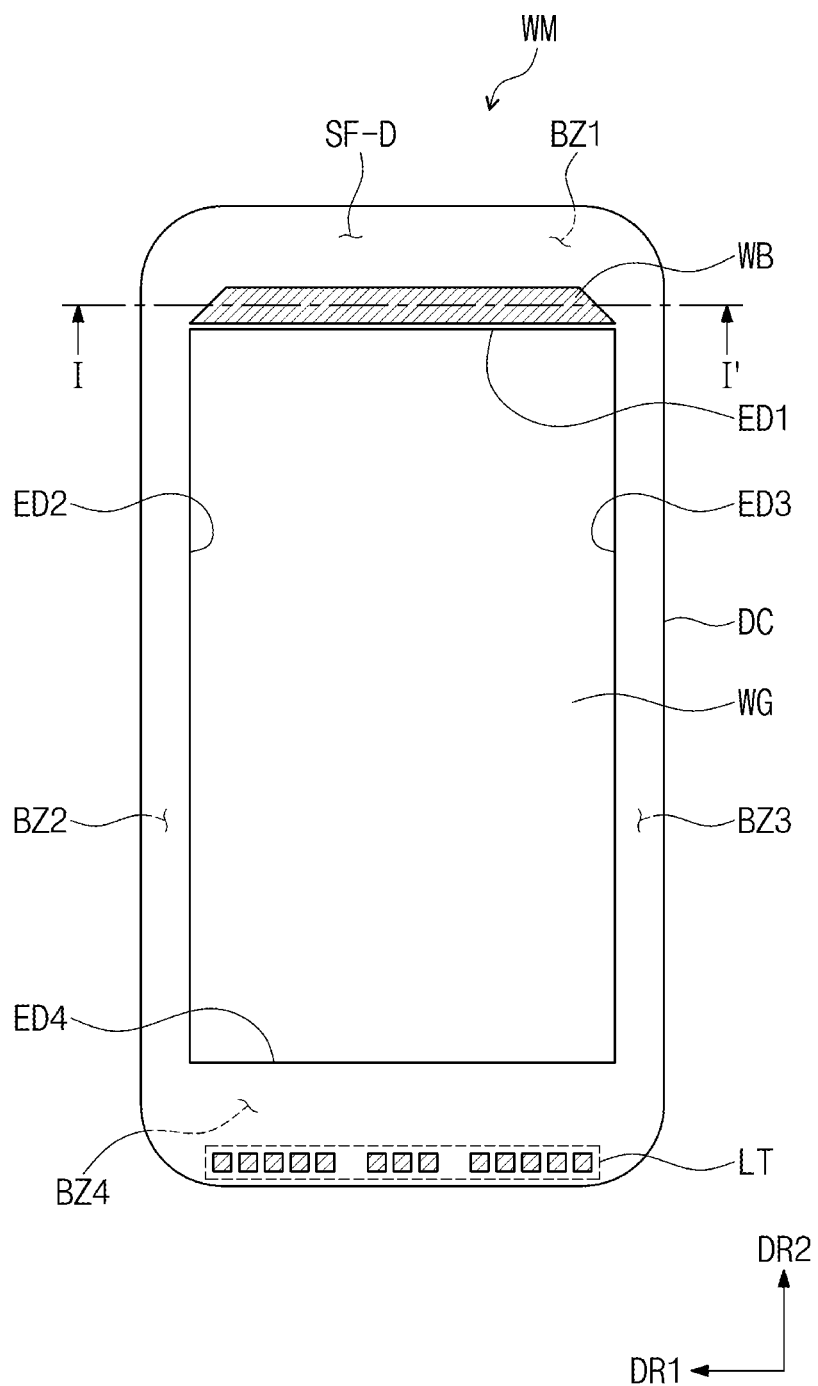
FIG. 4 is a plan view of a window member illustrated in FIG. 2.
Figure 5:
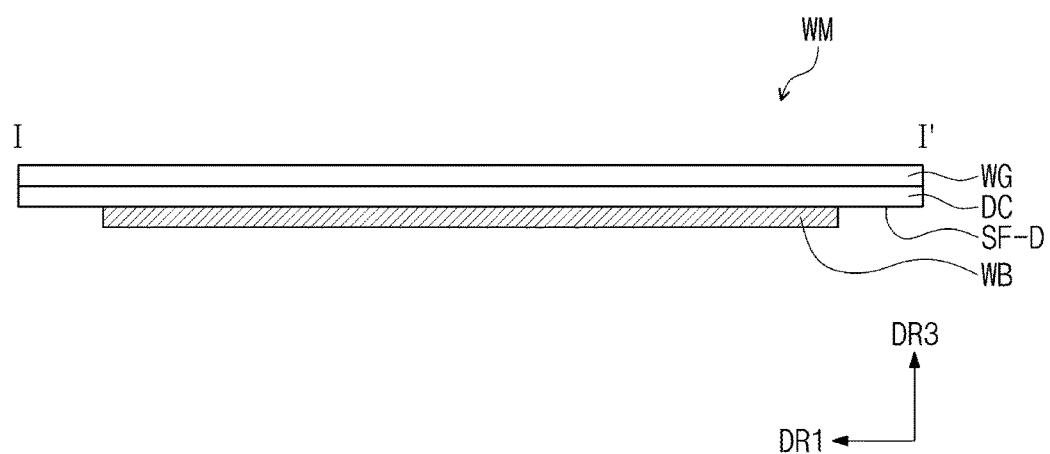
FIG. 5 illustrates a cross-section along the line I-I' of FIG. 4.

FIG. 4 is a plan view of the window member WM illustrated in FIG. 2. FIG. 5 illustrates a cross-section along the line I-I' of FIG. 4.

FIG. 4 illustrates a plane when the window member WM is viewed upward from the bottom. Referring to FIG. 5, the transparent base member WG, the deco member DC, and the block pattern WB are sequentially stacked.

Referring to FIGS. 2 and 4, the deco member DC includes inner boundary edges ED1, ED2, ED3, and ED4. The inner boundary edges ED1, ED2, ED3, and ED4 of the deco member DC are the same or substantially the same as, or correspond to, edges defining the first area AR1 of the transparent base member WG.

The first edge ED1 is adjacent to the block pattern WB on a plane defined by the first direction DR1 and the second direction DR2. The first edge ED1 may be parallel to, or in contact with; a longest edge from among edges defining the block pattern WB. The second edge ED2 extends from one end of the first edge ED1, and may be perpendicular or substantially perpendicular to the first edge ED1. The third edge ED3 extends from another end of the first edge ED1 and may be perpendicular or substantially perpendicular to the first edge ED1. That is, the third edge ED3 may be parallel to the second edge ED2. The fourth edge ED4 extends from one end of the second edge ED2 to one end of the third edge ED3. The fourth edge ED4 may be perpendicular or substantially perpendicular to the second edge ED2 and the third edge ED3, and may be parallel to the first edge ED1.

The second area AR2 of the transparent base member WG includes a first bezel area BZ1, a second bezel area BZ2, a third bezel area BZ3, and a fourth bezel area BZ4.

The first bezel area BZ1 extends from the first edge ED1 and overlaps with the pad unit PD (e.g., see FIG. 2). The second bezel area BZ2 extends from the second edge ED2. The third bezel area BZ3 extends from the third edge ED3. The fourth bezel area BZ4 extends from the fourth edge ED4.

The deco member DC overlaps with the second area AR2 of the transparent base member WG. That is, the deco member DC overlaps with the bezel areas BZ1, BZ2, BZ3, and BZ4. Referring to FIG. 5, the deco member DC may be printed (e.g., directly printed) on the transparent base member WG. However, the inventive concept is not limited thereto.

The block pattern WB overlaps with a portion of the first bezel area BZ1 adjacent the first edge ED1. Referring to FIG. 5, the block pattern WB is printed (e.g., directly printed) on the bottom surface SF-D of the deco member DC.

A length of the block pattern WB measured in the first direction DR1 decreases away from the first edge ED1. The block pattern WB has a shape considering a positional relationship with respect to components around the block pattern WB, but the inventive concept is not limited thereto.

A production information section LT overlaps with the fourth bezel area BZ4. The production information section LT may provide information on a production date and/or a production place of the window member WM. The production information section LT is printed (e.g., directly printed) on the bottom surface SF-D of the deco member DC.

Process efficiency may be increased by printing (e.g., directly printing) the block pattern WB and the production information section LT on the bottom surface SF-D of the deco member DC in a same or substantially the same process. Because a process error due to a printing process may be less than a process error due to a lamination process, the process error may be reduced according to an embodiment of the inventive concept.

Figure 6:
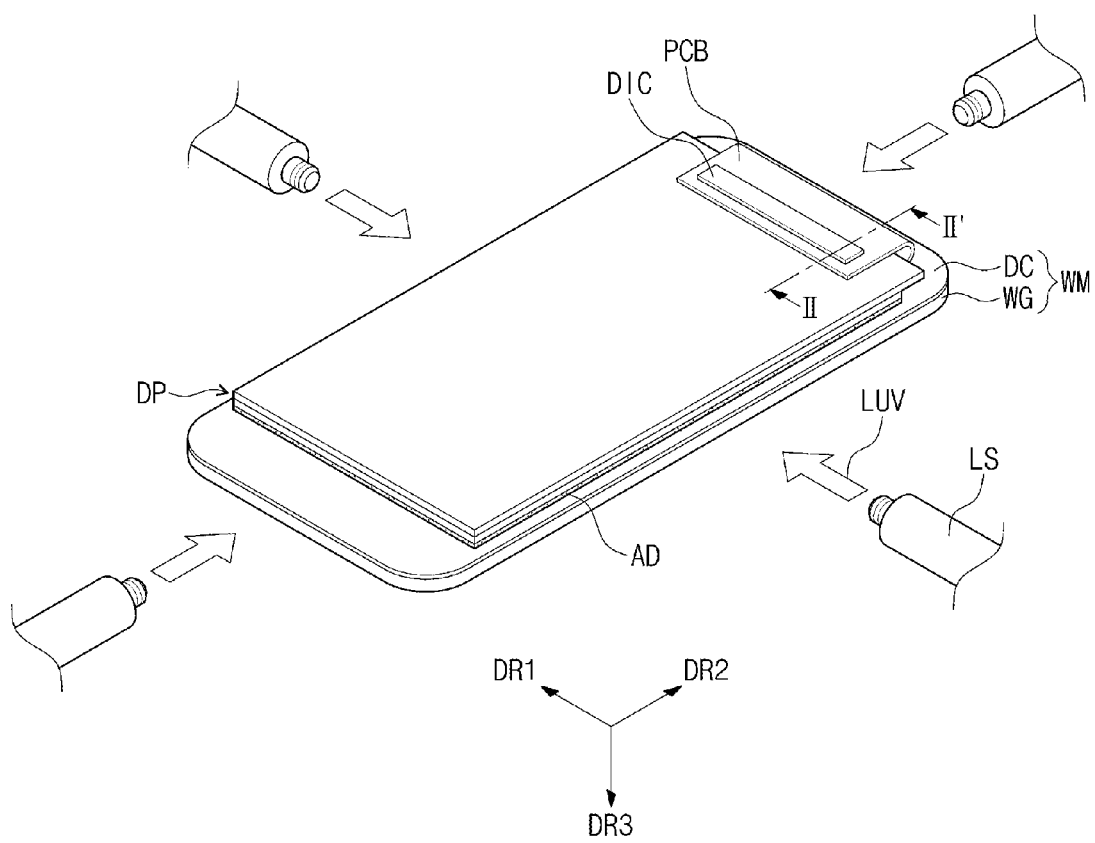
FIG. 6 is a perspective view illustrating a method of bonding a display panel and the window member to each other according to an embodiment of the inventive concept.
Figure 7:
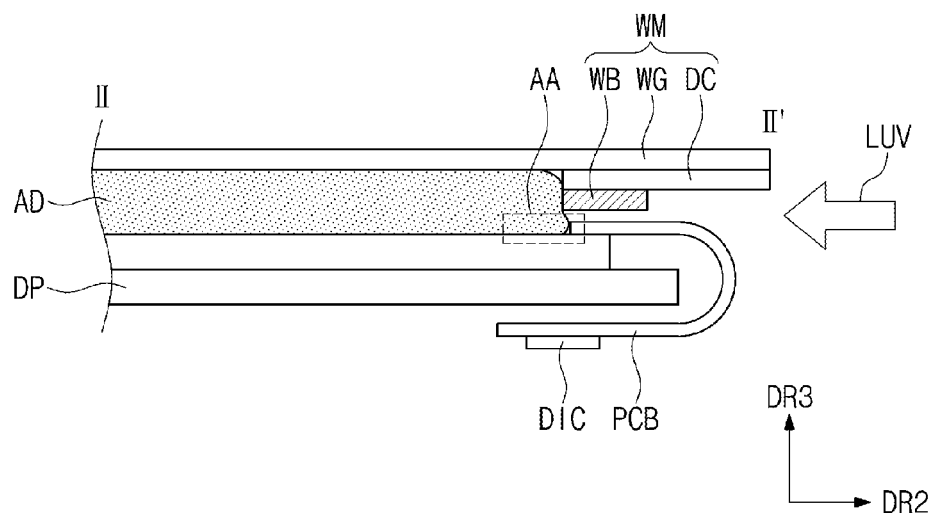
FIG. 7 illustrates a cross-section along the line II-II' of FIG. 6.

FIG. 6 is a perspective view illustrating a method of bonding the display panel DP and the window member WM to each other according to an embodiment of the inventive concept. FIG. 7 illustrates a cross-section along the line II-II' of FIG. 6.

The display panel DP and the window member WM are bonded to each other by the adhesive member AD. The adhesive member AD may be applied in a liquid state between the display panel DP and the window member WM, and the adhesive member AD in the liquid state may be cured by light LUV (hereinafter, referred to as a "light for curing") emitted from an external light source LS (hereinafter, referred to as "light source for curing"). The display panel DP and the window member WM are bonded to each other while the adhesive member AD is cured by the light LUV for curing.

The light LUV for curing may be incident on each edge of the display panel DP and on entire surfaces of the display panel DP. The adhesive member AD may be efficiently cured when the light LUV for curing is incident on the display panel DP, the adhesive member AD, and the window member WM from various directions.

The light LUV for curing may be ultraviolet light, which may effectively cure a resin or the like. However, the inventive concept is not limited thereto, and the light LUV for curing may be light having a wavelength range capable of effectively curing the liquid adhesive member AD.

Referring to FIG. 7, the liquid adhesive member AD includes a portion AA (hereinafter, referred to as an "uncured portion"), where the light LUV for curing may not reach. The printed circuit board PCB may block the light LUV for curing from reaching the uncured portion AA of the adhesive member AD, and accordingly, the uncured portion AA may be generated/may be uncured.

When the uncured portion AA of the liquid adhesive member AD is in contact with the deco member DC, a chemical reaction between the liquid adhesive member AD and the deco member DC may occur. Accordingly, properties of the deco member DC may be changed, and thus, the color and/or pattern of the deco member DC may be changed.

The block pattern WB may prevent or reduce changes in the properties of the deco member DC by blocking direct contact between the liquid adhesive member AD and the deco member DC.

Figure 8:
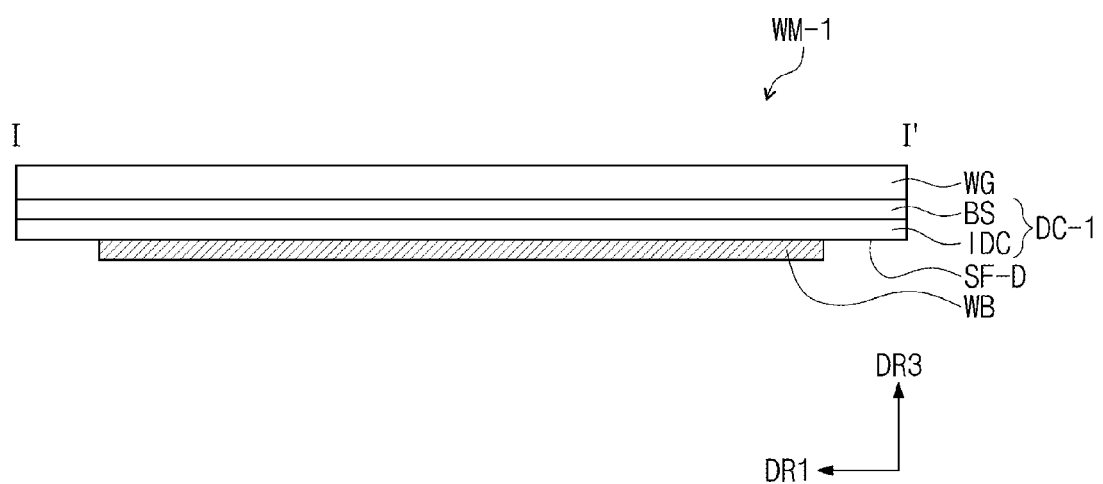
FIG. 8 illustrates a cross-section corresponding to the line I-I' of a display device of FIG. 4 according to an embodiment of the inventive concept.

FIG. 8 illustrates a cross-section corresponding to the line I-I' of a display device of FIG. 4 according to an embodiment of the inventive concept. FIG. 8 illustrates a cross-section of a window member WM-1 according to an embodiment of the inventive concept.

The window member WM-1 includes a transparent base member WG, a deco member DC-1, and a block pattern WB. Because descriptions of the transparent base member WG and the block pattern WB are the same or substantially the same as those for FIGS. 4 and 5, the descriptions of the transparent base member WG and the block pattern WB will not be repeated.

Referring to FIG. 8, the deco member DC-1 includes a deco base film BS and a deco ink layer IDC.

The deco base film BS is a film of transparent material, and may include polyvinylidene chloride (PVDC), polyethylene terephthalate (PET), nylon, polypropylene (PP), or polyethylene (PE). A thickness of the deco base film BS may be in a range of about 25 μm to about 100 μm. In a case in which the thickness of the deco base film BS is less than about 25 μm, because the deco base film BS is excessively thin, it may be difficult to handle the deco base film BS during a lamination process. In a case in which the thickness of the deco base film BS is greater than about 100 μm, because the deco base film BS is excessively thick, transparency of the deco base film BS may be affected (e.g., reduced).

The deco base film BS may be prepared by an inflation method, a T-die method, or a cast method. The deco base film BS may entirely or partially overlap with the transparent base member WG.

The deco ink layer IDC is printed on a surface (e.g., one surface) of the deco base film BS. In a case in which the deco ink layer IDC is printed on the deco base film BS, more diverse and delicate color representation may be possible when compared to a case in which the deco ink layer IDC is printed on the transparent base member WG. For example, the deco ink layer IDC may provide various colors through a lenticular pattern.

Figure 9:
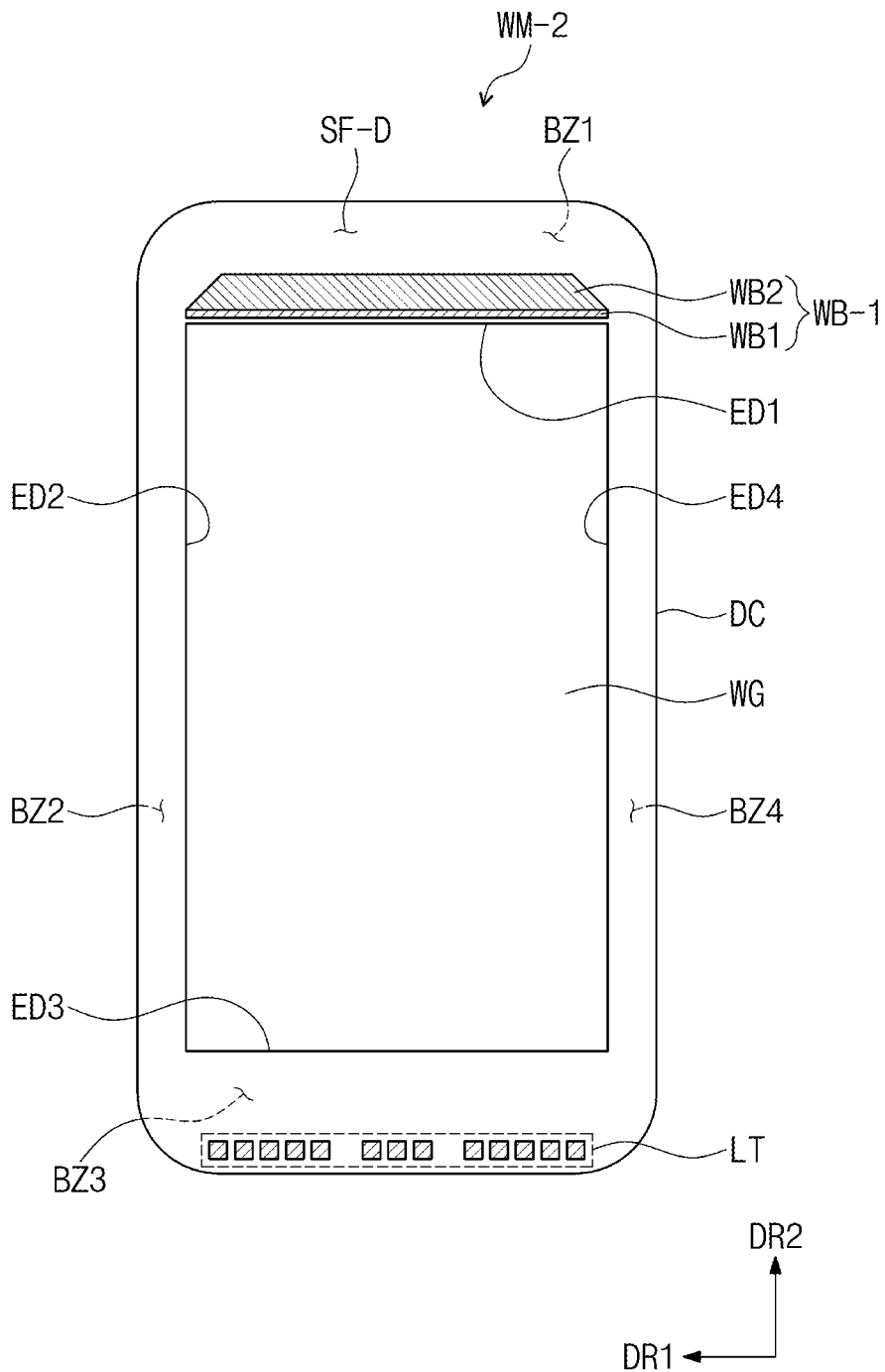
FIG. 9 is a plan view corresponding to a display device of FIG. 4 according to an embodiment of the inventive concept.

FIG. 9 is a plan view corresponding to a display device of FIG. 4 according to an embodiment of the inventive concept. FIG. 9 illustrates a plane of a window member WM-2 according to an embodiment of the inventive concept.

A block pattern WB-1 of the window member WM-2 may include a first block pattern WB1 and a second block pattern WB2.

The first block pattern WB1 may be printed (e.g., directly printed) on the deco member DC, and may be printed to have a smaller width than the block pattern WB described with reference to FIGS. 4 and 5. In addition, because description of the first block pattern WB1 is the same or substantially the same as that of the block pattern WB in FIGS. 4 and 5, the description of the first block pattern WB1 will not be repeated.

The second block pattern WB2, which is different from the first block pattern WB1 that is formed by printing, may be in the form of a tape. That is, the second block pattern WB2 may be attached to the deco member DC in the form of a tape.

Thus, the block pattern WB-1 may more effectively prevent or reduce the contact between the adhesive member AD and the deco member DC through a hybrid method in which the first block pattern WB1 and the second block pattern WB2, which are disposed by different methods, are used together.

Because descriptions of components other than the block pattern WB-1 are the same or substantially the same as those for FIGS. 4 and 5, the descriptions thereof will not be repeated.

Figure 10:
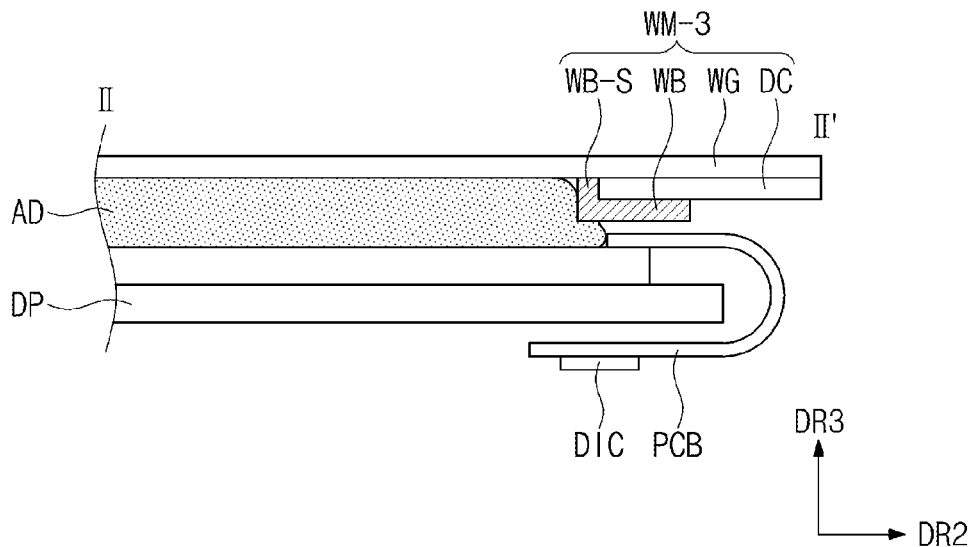
FIG. 10 illustrates a cross-section corresponding to the line II-II' of a display device of FIG. 6 according to an embodiment of the inventive concept.

FIG. 10 illustrates a cross-section corresponding to the line II-II' of a display device of FIG. 6 according to an embodiment of the inventive concept. FIG. 6 illustrates a method in which the display panel DP and a window member WM-3 are bonded to each other.

The window member WM-3 includes a transparent base member WG, a deco member DC, a block pattern WB, and an auxiliary block pattern WB-S. Because descriptions of the transparent base member WG, the deco member DC, and the block pattern WB are the same or substantially the same as the above descriptions, the descriptions thereof will not be repeated.

The auxiliary block pattern WB-S extends from the block pattern WB. The auxiliary block pattern WB-S is printed on a bottom surface of the transparent base member WG along a boundary between the adhesive member AD and the deco member DC.

The auxiliary block pattern WB-S may block (e.g., completely block) the contact between the adhesive member AD and the deco member DC, by being printed along the boundary between the adhesive member AD and the deco member DC.

The auxiliary block pattern WB-S may be formed by the same or substantially the same process as the process of forming the block pattern WB. Although the auxiliary block pattern WB-S and the block pattern WB are separately described, the auxiliary block pattern WB-S and the block pattern WB may be printed in an integrated shape.

Figure 11:
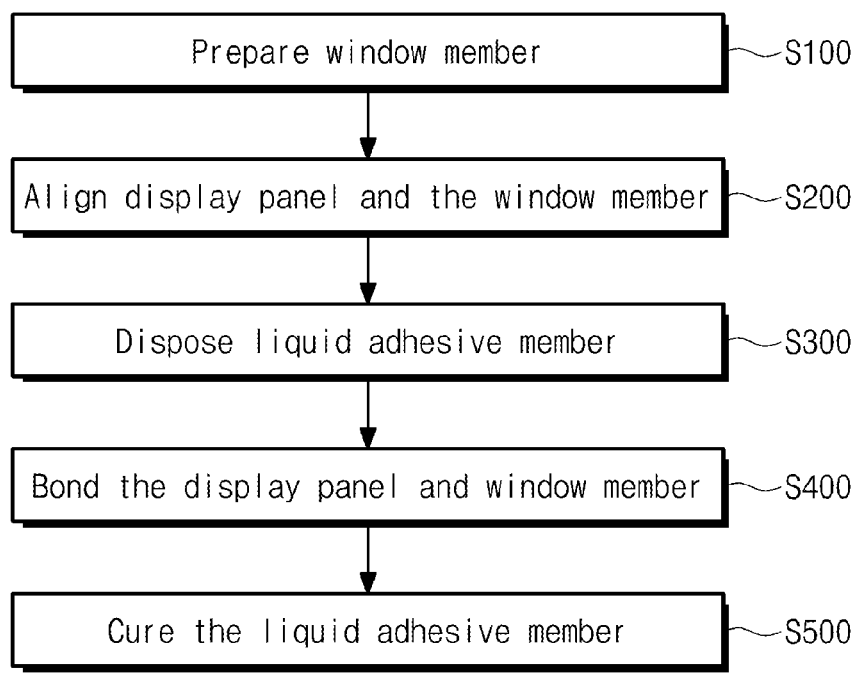
FIG. 11 is a flowchart illustrating a method of manufacturing a display device according to an embodiment of the inventive concept.
Figure 12A:
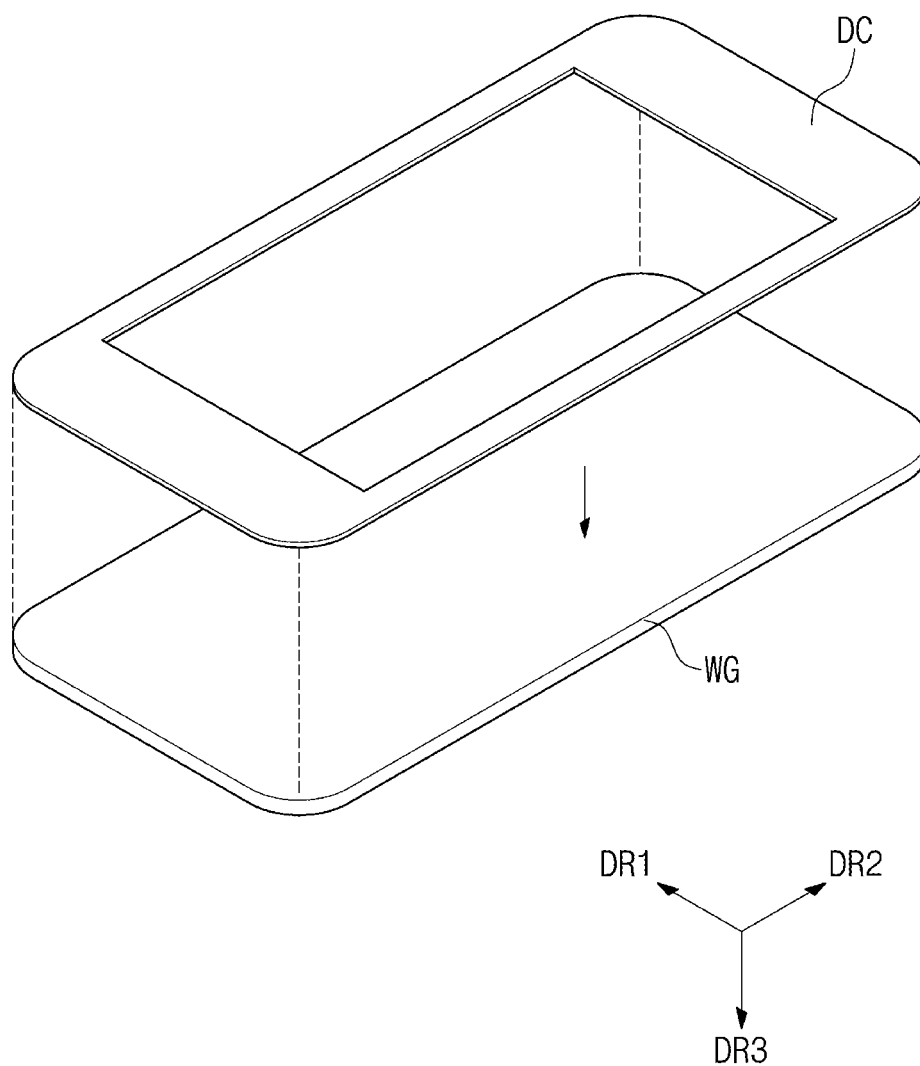
FIGS. 12A-12B are perspective views illustrating a method of manufacturing a display device corresponding to preparing a window member in the flowchart of FIG. 11.
Figure 12B:
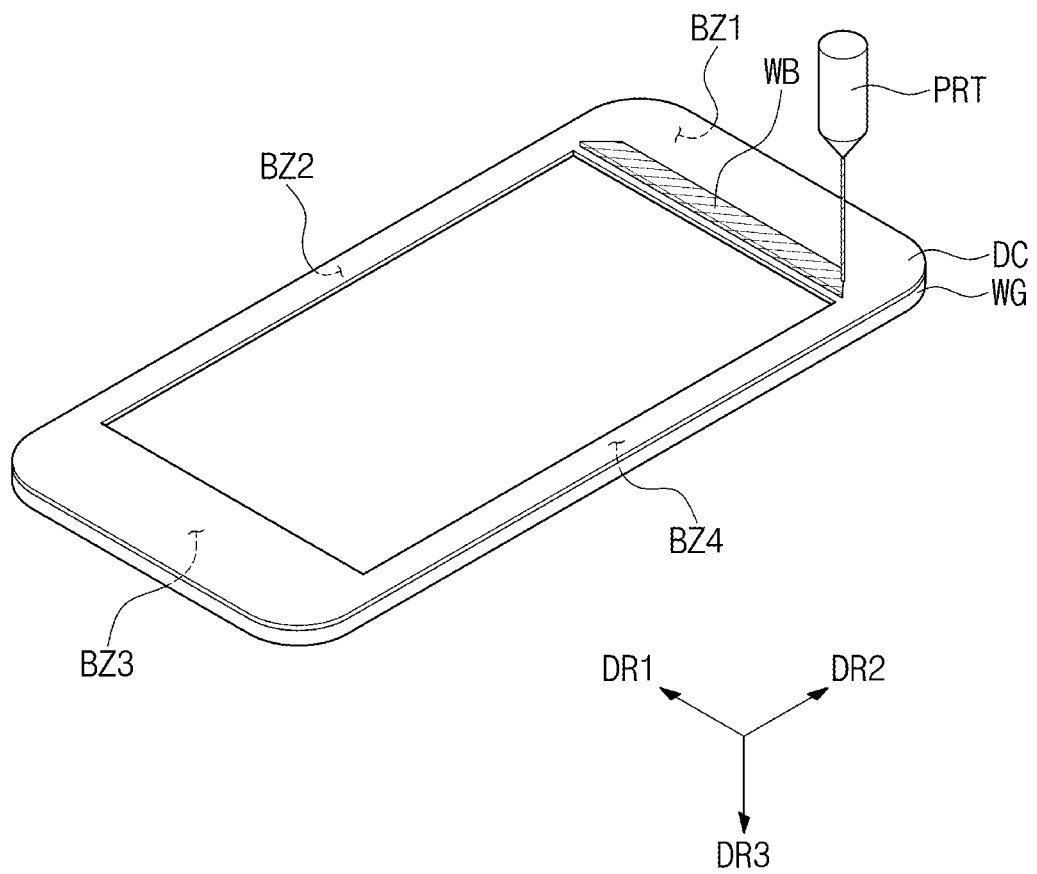

FIG. 11 is a flowchart illustrating a method of manufacturing a display device according to an embodiment of the inventive concept. FIGS. 12A and 12B are perspective views illustrating a method of manufacturing a display device corresponding to preparing a window member (S100) in the flowchart of FIG. 11.

Figure 13A:
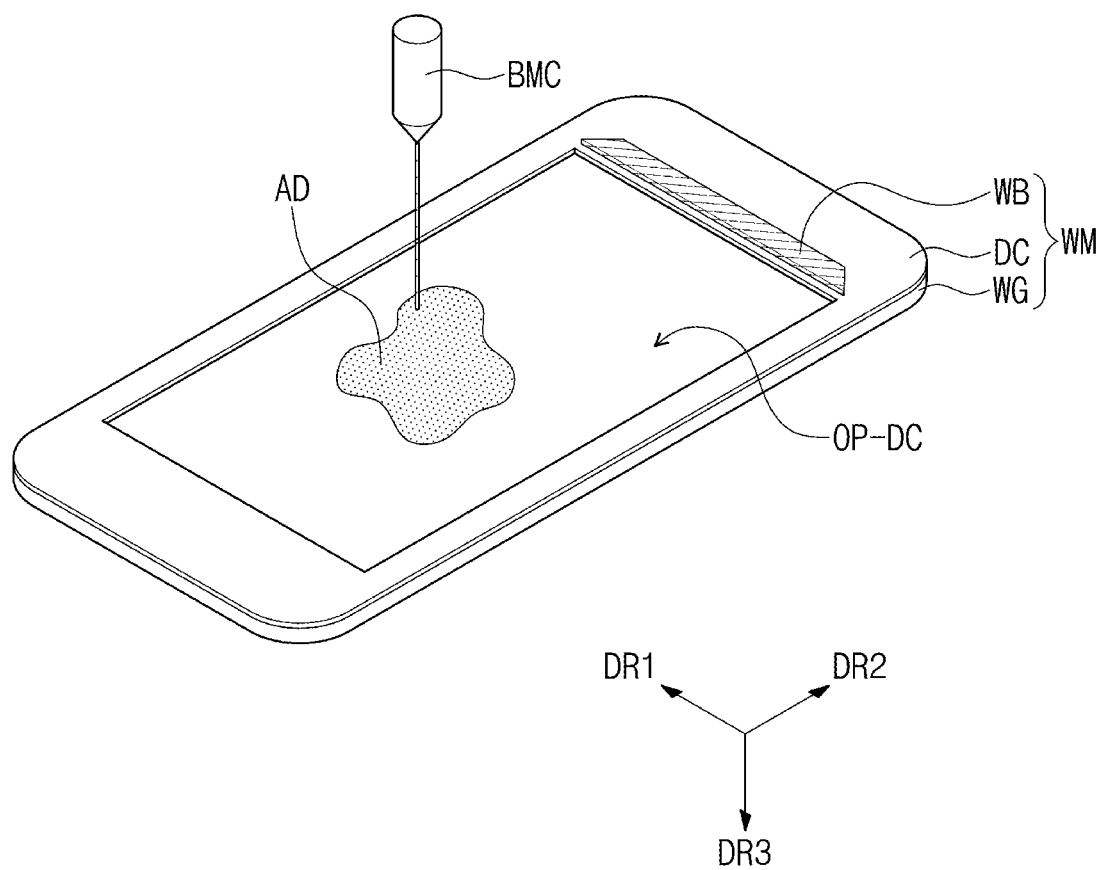
FIGS. 13A-13C are perspective views illustrating a method of manufacturing a display device corresponding to aligning a display panel and the window member, disposing a liquid adhesive member, bonding the display panel and the window member, and curing the liquid adhesive member in the flowchart of FIG. 11.
Figure 13B:
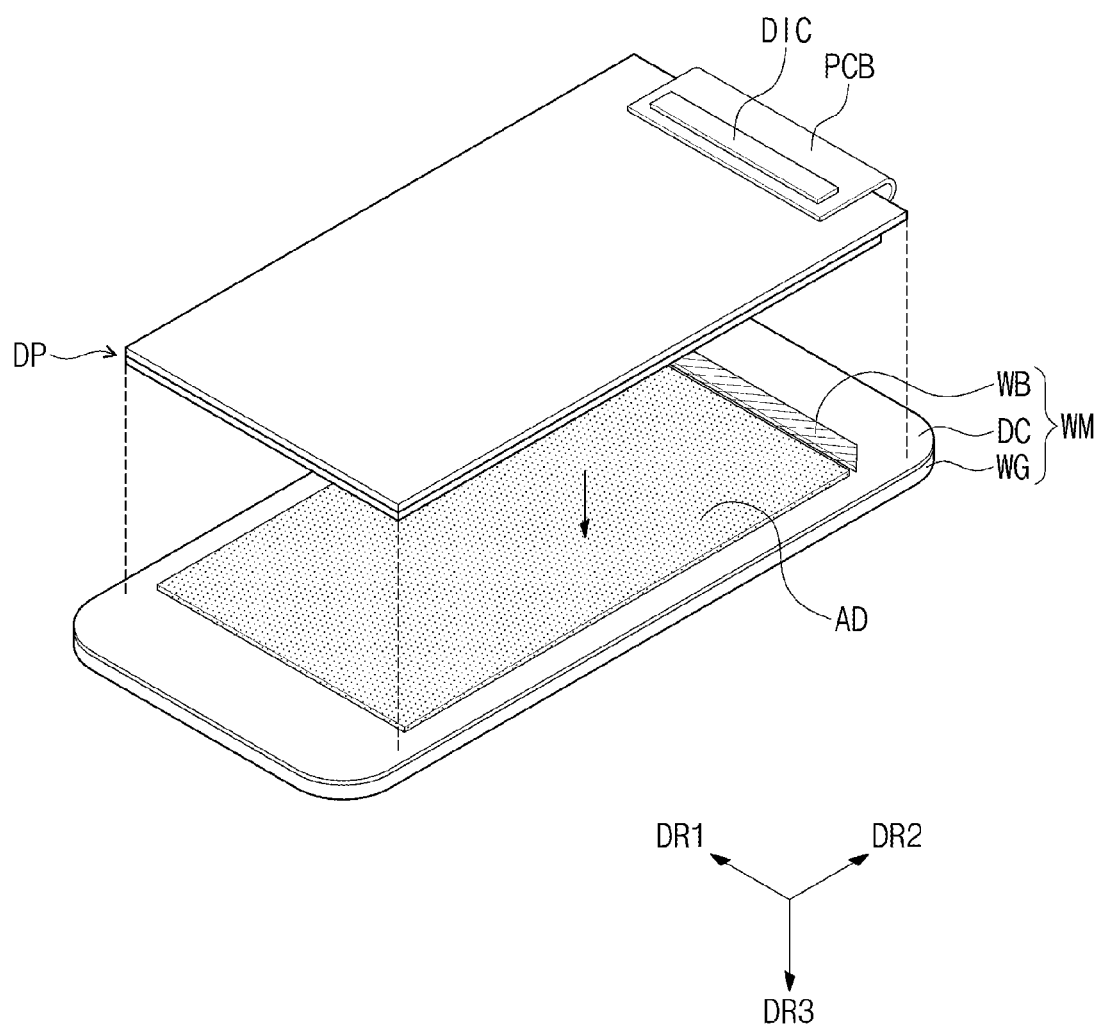
Figure 13C:
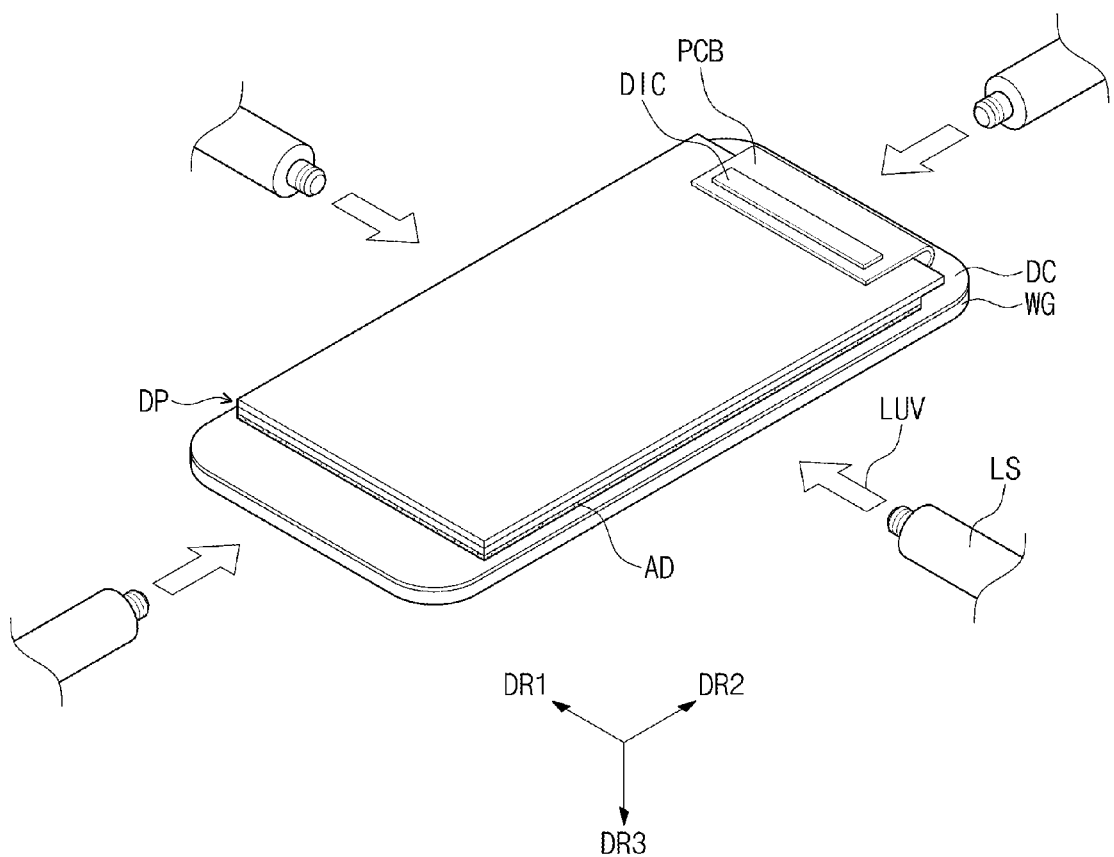

FIGS. 13A through 13C are perspective views illustrating a method of manufacturing a display device corresponding to aligning a display panel and the window member (S200), disposing a liquid adhesive member (S300), bonding the display panel and the window member (S400), and curing the liquid adhesive member (S500) in the flowchart of FIG. 11.

A method of manufacturing a display device according to an embodiment of the inventive concept includes preparing a window member (S100), aligning a display panel and the window member (S200), disposing a liquid adhesive member (S300), bonding the display panel and the window member (S400), and curing the liquid adhesive member (S500).

Referring to FIGS. 11 and 12A, during the preparing of the window member (S100), a deco member DC is disposed on a surface (e.g., one surface or a bottom surface) of a transparent base member WG. The transparent base member WG includes a first area AR1 (e.g., see FIG. 2) and a second area AR2 (e.g., see FIG. 2), and the deco member DC is disposed to overlap with the second area AR2.

The deco member DC may be printed (e.g., directly printed) on the transparent base member WG. However, the inventive concept is not limited thereto, for example, the deco member DC may be laminated on the transparent base member WG.

Referring to FIGS. 11 and 12B, during the preparing of the window member (S100), a block pattern WB may be printed on a surface (e.g., one surface or a bottom surface) of the deco member DC. A printer PRT configured to inject an ink may be used to print the block pattern WB.

Referring to FIGS. 11 and 13A, during the aligning of the display panel and the window member (S200), a display panel DP and a window member WM may be aligned to face each other (e.g., see FIG. 13B).

During the disposing of the liquid adhesive member (S300), a liquid adhesive member AD is disposed between the display panel DP and the window member WM. A bonding machine BMC configured to discharge the liquid adhesive member AD may be used to apply the liquid adhesive member AD.

Although FIG. 13A shows that the liquid adhesive member AD is coated on the window member WM, the inventive concept is not limited thereto. For example, the liquid adhesive member AD may be coated on the display panel DP.

Referring to FIGS. 11 and 13B, during the bonding of the display panel and the window member (S400), the display panel DP and the window member WM are bonded to each other to allow the block pattern WB to be adjacent a boundary BDL between a display area DA and a non-display area NDA.

The liquid adhesive member AD is disposed to not overlap with the block pattern WB. The block pattern WB may prevent or substantially prevent the liquid adhesive member AD from being introduced toward the deco member DC when the display panel DP and the window member WM are pressed together.

Referring to FIGS. 11 and 13C, during the curing of the liquid adhesive member (S500), the liquid adhesive member AD is cured by using external light LUV. The display panel DP and the window member WM may be firmly bonded to each other as the adhesive member AD is cured. Because descriptions of a light source LS for curing and the light LUV for curing are the same or substantially the same as those for FIG. 6, the descriptions thereof will not be repeated.

According to one or more embodiments of the inventive concept, a display device, which may prevent or reduce changes in color of a bezel due to the deterioration of a deco member, may be provided.

According to one or more embodiments of the inventive concept, a method of manufacturing the display device, which may prevent or reduce changes in the color of the bezel due to the deterioration of the deco member, may be provided. Thus, quality of the appearance of the display device may be improved.

Although the present invention has been described with reference to the exemplary embodiments thereof, it will be appreciated by those skilled in the art that various modifications and/or changes to the example embodiments of the present invention may be made, without departing from the spirit and scope of the present invention, as set forth in the following claims and their equivalents.

What is claimed is:
1. A display device comprising:
a window member comprising:
a transparent base member having a first area and a second area; and a deco member under the transparent base member and overlapping with the second area;

a display panel under the window member and having a display area overlapping with the first area, and a non-display area overlapping with the second area, the display panel comprising a pad unit on a portion of the non-display area;

an adhesive member between the window member and the display panel for bonding the window member and the display panel to each other;

a printed circuit board connected to the pad unit of the display panel; and a block pattern printed on a portion of a bottom surface of the deco member that is adjacent the adhesive member, the block pattern overlapping with the pad unit, and being insulated from the pad unit.

2. The display device of claim 1, wherein the block pattern is printed along any one of edges defining a boundary between the adhesive member and the deco member.

3. The display device of claim 2, wherein the block pattern is configured to block contact between the adhesive member and the deco member.

4. The display device of claim 3, further comprising an auxiliary block pattern printed on a bottom surface of the transparent base member along the boundary between the adhesive member and the deco member, the auxiliary block pattern extending from the block pattern.

5. The display device of claim 3, further comprising a blocking tape on a portion of the bottom surface of the deco member adjacent the block pattern, the blocking tape being configured to prevent the adhesive member from contacting the deco member.

6. The display device of claim 1, wherein the deco member is directly printed on the transparent base member.

7. The display device of claim 1, wherein the deco member comprises:
a deco base film; and
a deco ink layer printed on a bottom surface of the deco base film.

8. The display device of claim 1, wherein a width of the block pattern decreases away from the adhesive member on a plane parallel to a plane on which the display area is defined.

9. The display device of claim 1, wherein the adhesive member comprises a resin.

10. The display device of claim 1, wherein:
the first area comprises:
a first edge parallel to a boundary between the adhesive member and the deco member;
a second edge extending from one end of the first edge and being perpendicular to the first edge;
a third edge extending from another end of the first edge and being perpendicular to the first edge; and
a fourth edge extending from one end of the second edge to one end of the third edge, and being parallel to the first edge;
the second area comprises:
a first bezel area extending from the first edge and overlapping with the pad unit;
a second bezel area extending from the second edge;
a third bezel area extending from the third edge and facing the first bezel area, the first area being between the second bezel area and the third bezel area; and a fourth bezel area extending from the fourth edge and facing the second bezel area, the first area being between the first bezel area and the fourth bezel area; and the block pattern overlaps with the first bezel area.

11. A display device comprising:
a window member comprising:
a transparent base member;
a deco member overlapping with an edge of the transparent base member; and
a block pattern printed under the deco member along any one of inner boundary edges of the deco member;
a display panel bonded to a bottom of the window member by an adhesive member; and
a printed circuit board between the window member and the display panel overlapping with the block pattern at a side of the display panel,
wherein the block pattern prevents contact between the deco member and the adhesive member.

12. The display device of claim 11, further comprising an auxiliary block pattern printed on a bottom surface of the transparent base member along a boundary between the adhesive member and the deco member, the auxiliary block pattern extending from the block pattern.

13. The display device of claim 11, further comprising a blocking tape on a portion of a bottom surface of the deco member adjacent to the block pattern, the blocking tape blocking contact between the deco member and the adhesive member.

14. The display device of claim 11, wherein the deco member is directly printed on the transparent base member.

15. The display device of claim 11, wherein the deco member comprises:
a deco base film; and
a deco ink layer printed on a bottom surface of the deco base film.

16. The display device of claim 11, wherein a width of the block pattern decreases away from the adhesive member.

17. The display device of claim 11, wherein the adhesive member comprises a resin.

18. A display device comprising:
a window member comprising:
a transparent base member having a first area and a second area; and
a deco member under the transparent base member and overlapping with the second area;
a display panel under the window member and having a display area overlapping with the first area, and a non-display area overlapping with the second area, the display panel comprising a pad unit on a portion of the non-display area;
an adhesive member between the window member and the display panel for bonding the window member and the display panel to each other;
a printed circuit board connected to the pad unit of the display panel; and
a block pattern printed on a portion of a bottom surface of the deco member that is adjacent the adhesive member, the block pattern overlapping with the pad unit,
wherein a portion of the printed circuit board is disposed between the block pattern and pad unit.

* * * * *